United States Patent [19]
Meng

[11] Patent Number: 5,386,374
[45] Date of Patent: Jan. 31, 1995

[54] METHOD FOR SIMULATING THE SURFACE CONTOURS OF A LAYER MATERIAL TO BE FORMED OVER A BASE STRUCTURE

[75] Inventor: Peter P. Meng, Sunnyvale, Calif.

[73] Assignee: National Semiconductor Corporation, Santa Clara, Calif.

[21] Appl. No.: 717,148

[22] Filed: Jun. 18, 1991

[51] Int. Cl.[6] .............................................. G06F 15/60
[52] U.S. Cl. .................................. 364/578; 364/488; 427/9
[58] Field of Search .................. 364/488, 489, 578, 9; 427/9

[56] References Cited

U.S. PATENT DOCUMENTS

| | | | |
|---|---|---|---|
| 4,600,597 | 7/1986 | White et al. | 427/9 |
| 5,067,101 | 11/1991 | Kunikiyo et al. | 364/578 |
| 5,070,469 | 12/1991 | Kunikiyo et al. | 364/578 |

OTHER PUBLICATIONS

Suprem IV Examples, Mark E. Law, Conor Rafferty and Robert Dutton, Stanford University Press, Jul., 1987.

Primary Examiner—Vincent N. Trans
Attorney, Agent, or Firm—H. Donald Nelson; Edward C. Kwok; Richard J. Roddy

[57] ABSTRACT

An improved method for simulating the surface contours of a layer of material to be formed over a base structure using a string algorithm is described. The method of the string algorithm includes the steps of defining old surface points along the base structure, defining a set of possible new surface points, and defining a set of orderly array of points, from the set of new surface points, which define the surface contours of the simulated layer of material formed over the base structure.

6 Claims, 12 Drawing Sheets

METHOD FOR SIMULATING THE SURFACE CONTOURS OF A LAYER MATERIAL TO BE FORMED OVER A BASE STRUCTURE

BACKGROUND OF THE INVENTION

1. Technical Field

The present invention relates to methods of device simulation. More particularly, the present invention relates to a method for simulating the surface contours of a layer of material to be formed over a base structure using a string algorithm.

2. Description of the Prior Art

It is often desirable to simulate the surface contours of a layer of material which is to be formed over a base surface. For example, in the semiconductor art, it is desirable to provide an accurate method of simulating the surface contours of a material, such as a polysilicon layer or an oxide layer, which is to be formed over a silicon substrate. A simulation of the surface topology of the new material would provide a semiconductor process engineer with valuable information, such as whether the additional formation of layers on top of the simulated layer is feasible.

Methods for simulating the surface contours of a layer of material formed over a base surface are known in the prior art. The SUPREM IV computer modeling algorithm, developed at Stanford University, Palo Alto, Calif., is an example of one such known method. A detailed discussion of the SUPREM IV method is provided in a paper titled SUPREM IV EXAMPLES, by Mark E. Law, Conor Rafferty and Robert W. Dutton, Stanford University Press, July 1987.

THE SUPREM IV METHOD

The SUPREM IV method relies on a series of steps to simulate the surface contours of a material to be formed over a contoured base structure. The steps of the SUPREM IV method are briefly described herein.

Figure 1:
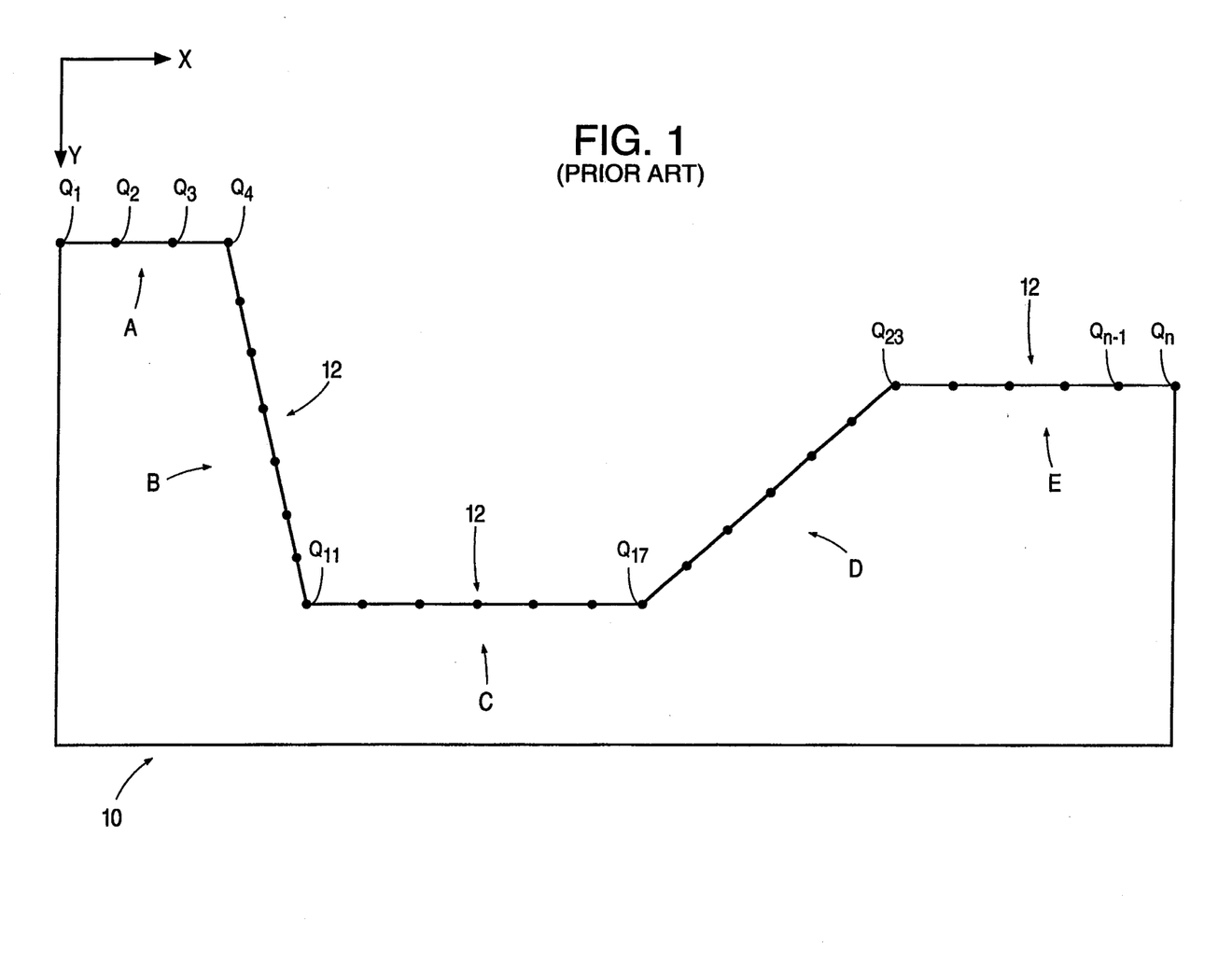
FIG. 1 is a base structure for illustrating the first step of the simulation method according to the prior art.

Referring to FIG. 1, a base structure is shown. The base structure 10 includes a contoured top surface (hereinafter old surface 12). For purposes of describing the operation of the SUPREM IV method, the old surface 12 is segmented into a plurality of segments A, B, C, D and E. The segments A through E indicate a change in the surface height or topography of the old surface 12. Concave-shaped regions of old surface 12 are defined by the intersection of segments B/C and C/D, and convex-shaped regions are defined by the intersections of segments A/B and D/E.

Figure 2:
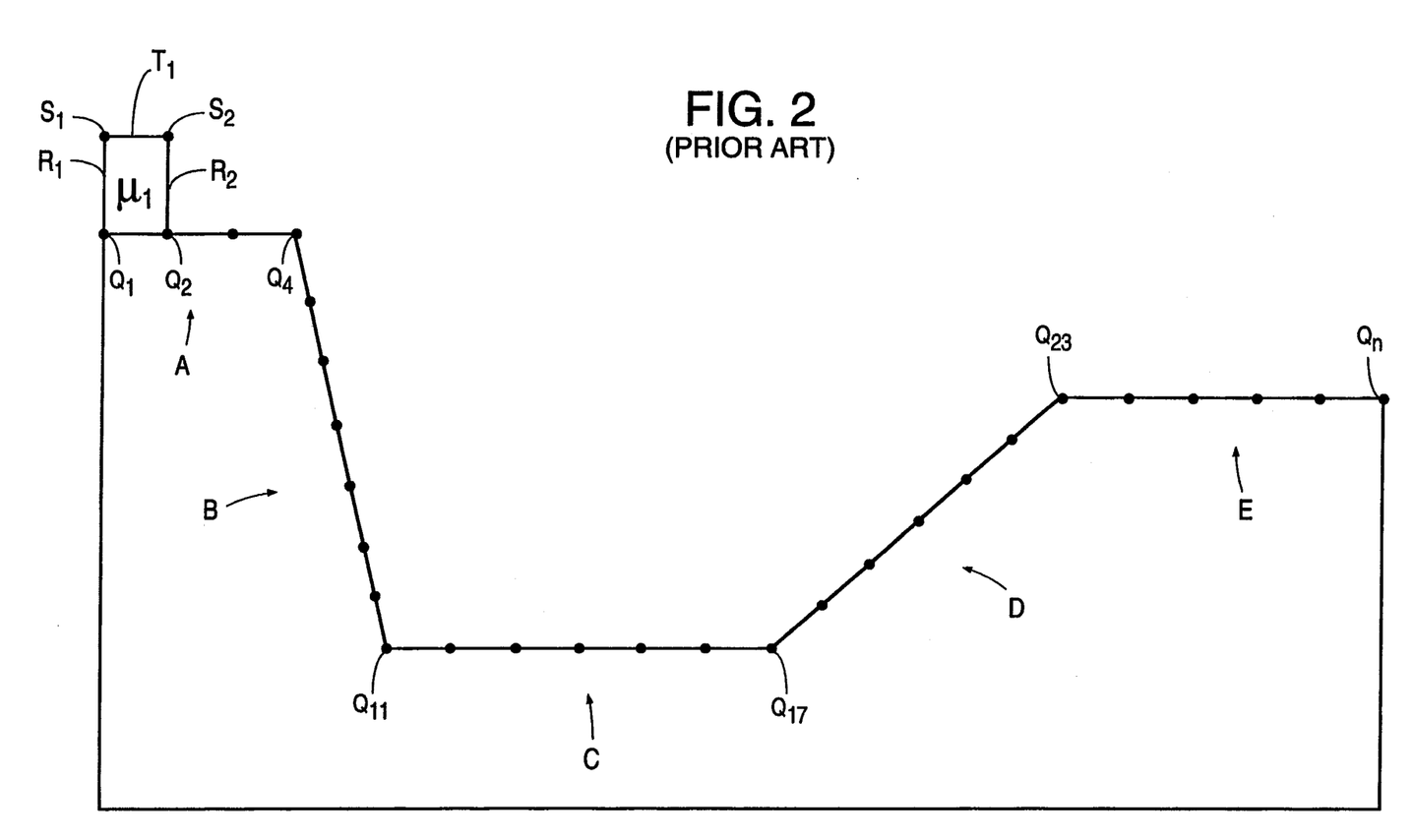
FIG. 2 is the base structure after an intermediate step in the simulation method according to the prior art.

In the first step of the SUPREM IV method, a plurality of equally spaced old surface points $Q_1$ through $Q_n$ are defined along the old surface 12 using an (X,Y) coordinate system. In the second step, as illustrated in FIG. 2, the first two adjacent old surface points $Q_1$ and $Q_2$ are paired together and normal vectors $R_1$ and $R_2$ are constructed therefrom. The length (L) of the normal vectors $R_1$ and $R_2$ is equal to the thickness or height of the layer which is to be formed over the old surface 12. For example, if a one micron layer is to be formed over the base structure 10, (L) equals one micron. The end point of the normal vectors $R_1$ and $R_2$ define new surface points $S_1$ and $S_2$ respectively.

In the third step, a new surface line $T_1$ is generated between the pair of new surface points $S_1$ and $S_2$. A box $U_1$ is thus formed by the portion of the old surface 12 between old surface points $Q_1$ and $Q_2$, normal vectors $R_1$ and $R_2$, and new surface line $T_1$.

Figure 3:
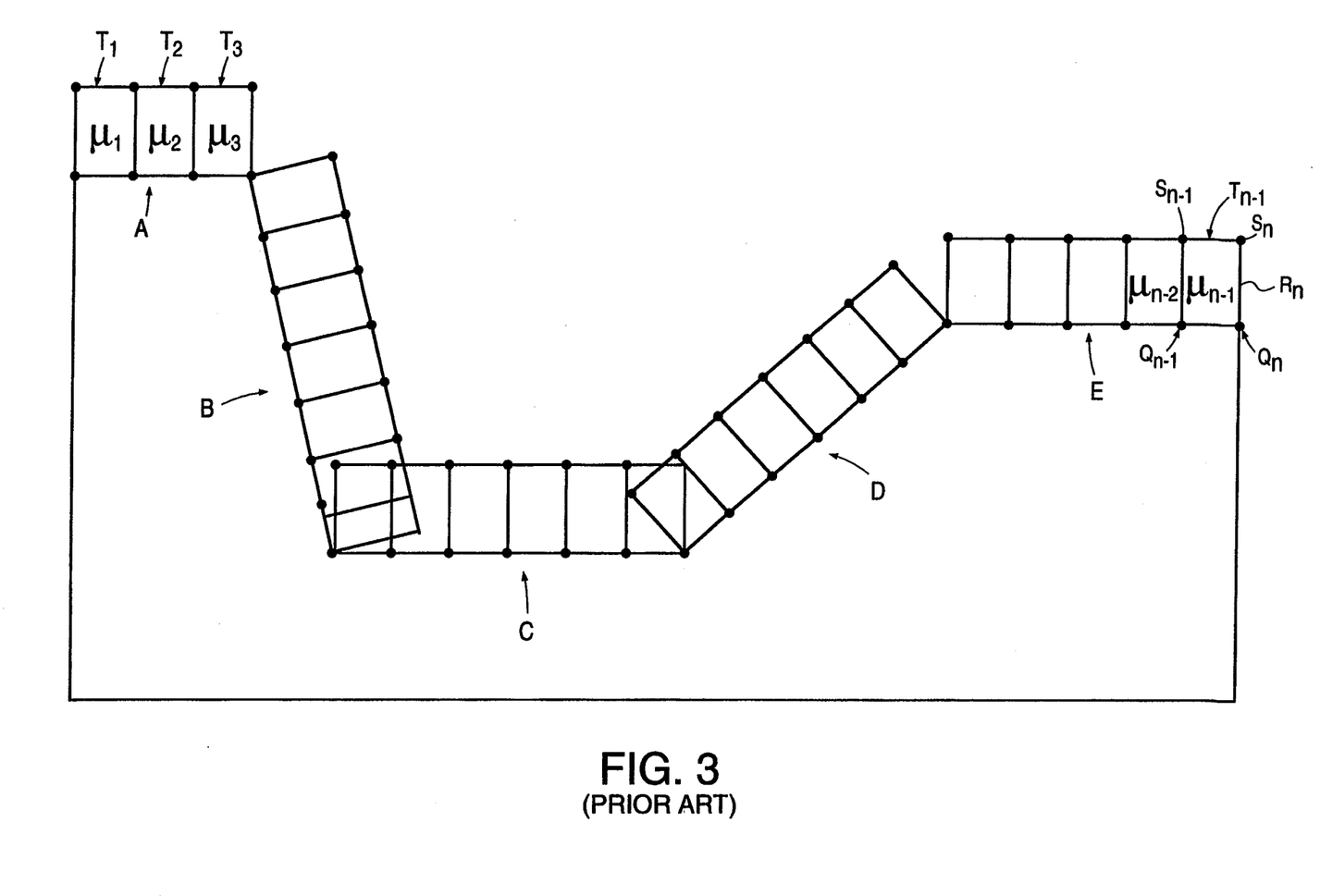
FIG. 3 is the base structure after another intermediate step in the simulation method according to the prior art.

In the SUPREM IV method, as illustrated in FIG. 3, steps two and three are repeated for each pair of new surface points from $Q_1$ to $Q_n$. The Steps two and three are repeated sequentially, starting with pair $Q_1$ and $Q_2$, and then $Q_2$ and $Q_3$, and so on until the normal vectors R and new surface line T have been constructed for the last pair $Q_{n-1}$ and $Q_n$. As a result, a series of boxes $U_1$ to $U_{n-1}$ are formed across the old surface 12. For the sake of clarity, labelling of many of the old surface points Q, the normal vectors R, new surface points T and the new surface lines T have been omitted from FIG. 3.

In the simulation of the new surface over the old surface 12, several situations are worthy of further discussion.

The first situation occurs over the relatively flat portions of the old surface 12. In these flat portions, the new surface line T of one box intersects or touches the new surface line of the adjacent boxes. For example, the new surface line $T_2$ intersects the adjacent new surface lines $T_1$ and $T_3$. The combination of new surface lines $T_1$, $T_2$ and $T_3$ defines a simulation of the new surface above segment A of the old surface. The simulation of the new surface over relatively, flat portions of the old surface of segments B through E is formed in a similar manner.

Figure 4:
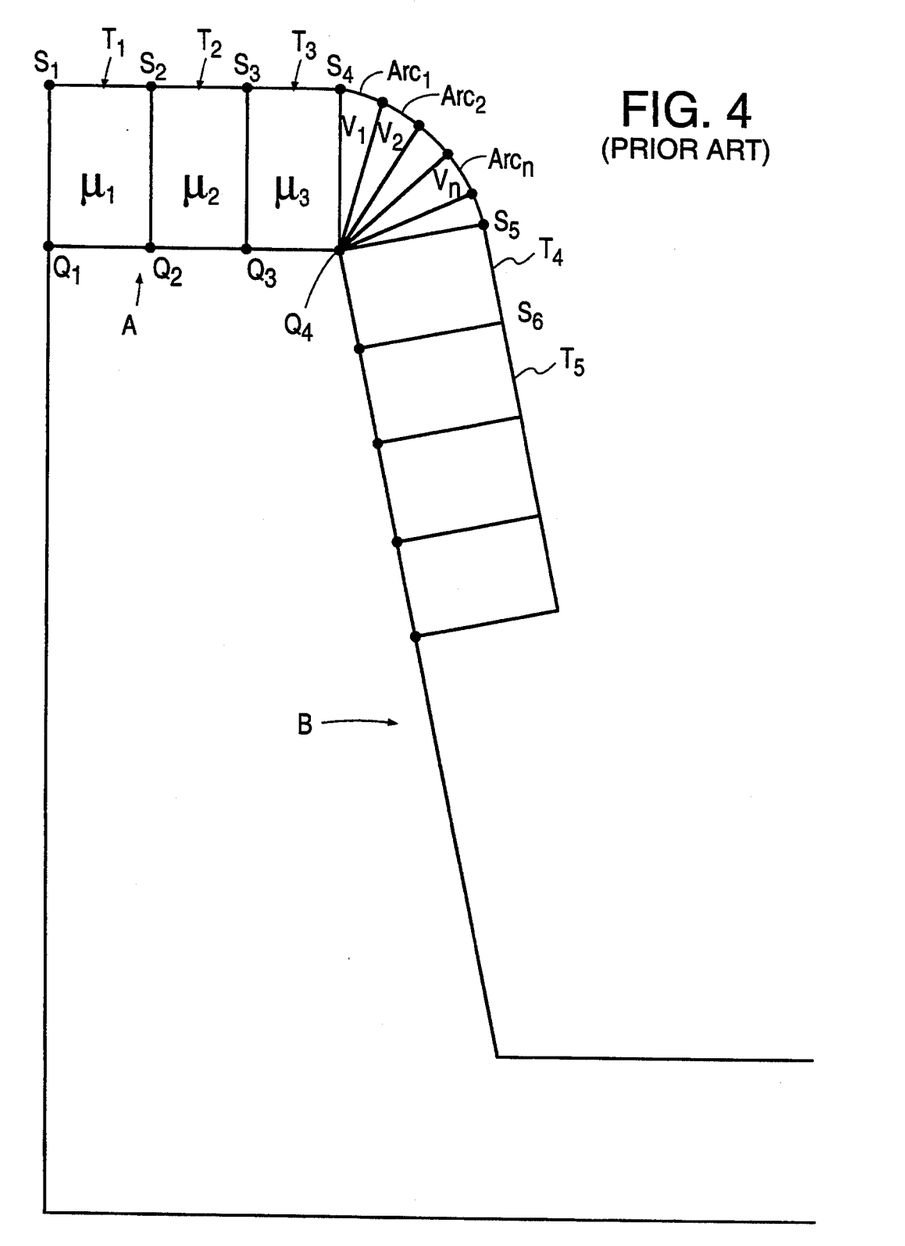
FIG. 4 is an enlarged view of a convex region of the base structure for illustrating the simulation method according to the prior art method.

The second situation occurs at the convex regions, such as those formed by segments A/B and D/E. Referring to FIG. 4, an enlarged diagram of the convex region formed by segment A/B is shown. At the intersection of segments A/B, the SUPREM IV method generates new surface points $Arc_1$ to $Arc_n$ along an arc between new surface points $S_4$ and $S_5$. The new surface points $Arc_1$ to $Arc_n$ are defined by generating, at a user-defined angle, a plurality of vectors $V_1$ to $V_n$ having a length (L) from the old surface point $Q_4$. By connecting the new surface points $Arc_1$ to $Arc_n$, the new surface over the convex region A/B is simulated.

Figure 5:
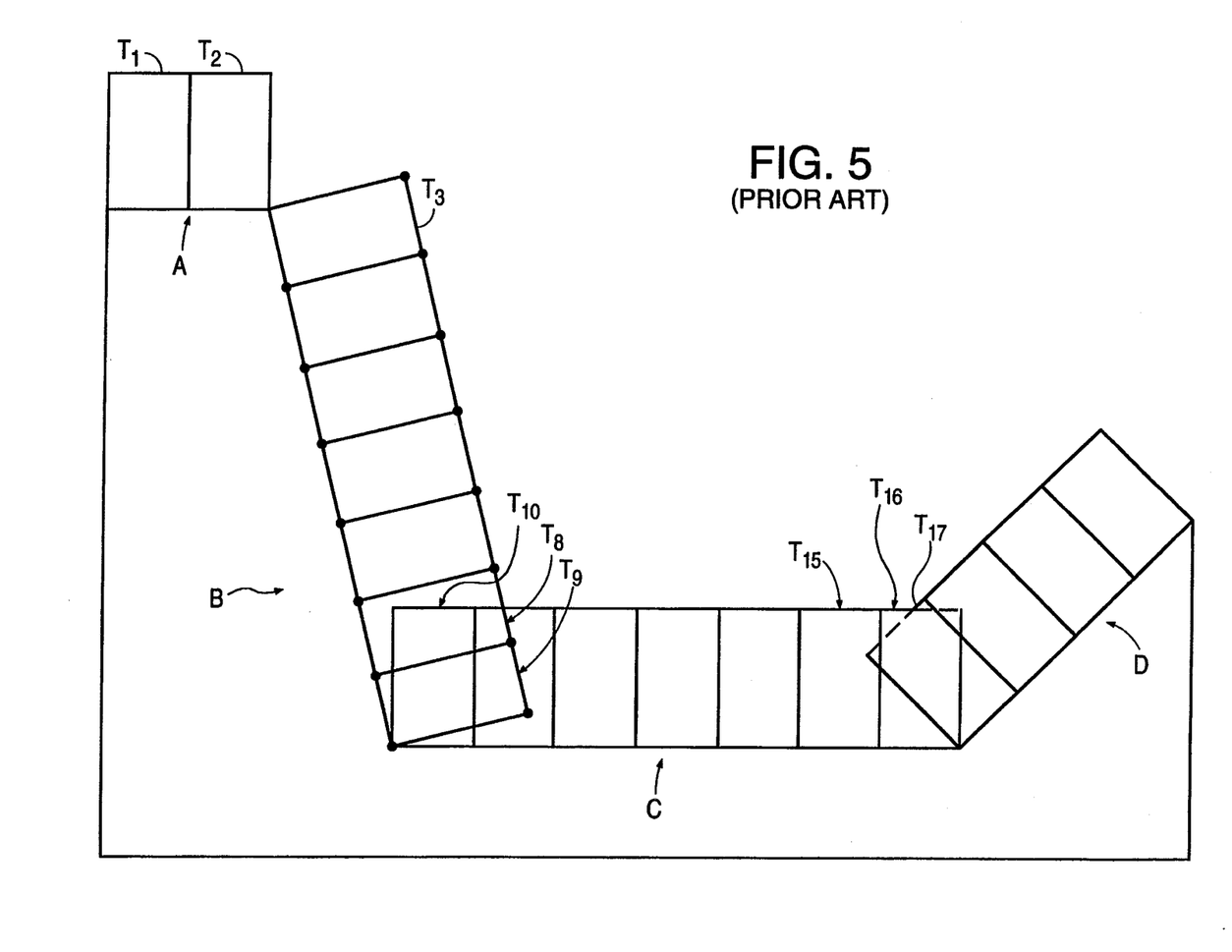
FIG. 5 is an enlarged view of concave regions of the base structure for illustrating the simulation method according to the prior art method.

The third situation occurs at the concave regions, such as those formed by segments B/C and C/D. Referring to FIG. 5, the concave regions formed by segments B/C and C/D is shown. A shortcoming of the SUPREM IV method is that it does not have a systematic way of simulating the new surface above certain concave regions on the old surface 12.

To illustrate an example of where the SUPREM IV method is capable of simulating the new surface at a concave region, attention is directed to the intersection of segments C/D. During the normal reiteration of steps two and three as described above, new surface lines $T_{15}$, $T_{16}$ and $T_{17}$ are generated. Since the new surface line $T_{17}$ intersects with new surface line $T_{16}$, the SUPREM IV method uses the exposed portions (solid lines) of the two new surface lines as the simulated new surface over this concave region. The portions of the new surface lines $T_{17}$ and $T_{16}$ (dashed lines) which lie underneath the simulated new surface are ignored in the simulation.

In contrast, as an example of a situation where the SUPREM IV method is incapable of simulating the new surface at a concave region, attention is directed to the concave region formed by the intersection of segments B/C. During the normal reiteration of steps two and three, new surface lines $T_8$, $T_9$ and $T_{10}$ are respectively generated. During the generation of new surface line $T_{10}$, the new surface line $T_{10}$ never touches or intersects new surface line $T_9$ because of the pronounced concave relationship between the two segments B and C. Thus, the continuity of the simulation of the new surface is interrupted.

The SUPREM IV algorithm provides no corrective steps to overcome this break in the continuity of the simulated new surface. As a result, the execution of the SUPREM IV algorithm is halted, and the remainder of the simulation of the new surface is not performed. The SUPREM IV method is thus limited to simulating new surfaces over relatively flat surfaces that do not contain severe concave regions. Because the SUPREM IV method often does not yield useful results, it is not a useful tool for designing and building actual products, such as semiconductor devices.

THE TRIANGULATION METHOD

In applications of the SUPREM IV method involving semiconductor structures, an additional triangulation method is performed to aid in the calculation of the dopant profile in the new material formed over the base substrate 10. Assuming the new surface is simulated without any problems, the triangulation algorithm uses the results of the SUPREM IV method, (i.e., the boxes $U_1$ through $U_{n-1}$) as its starting point.

Figure 6:
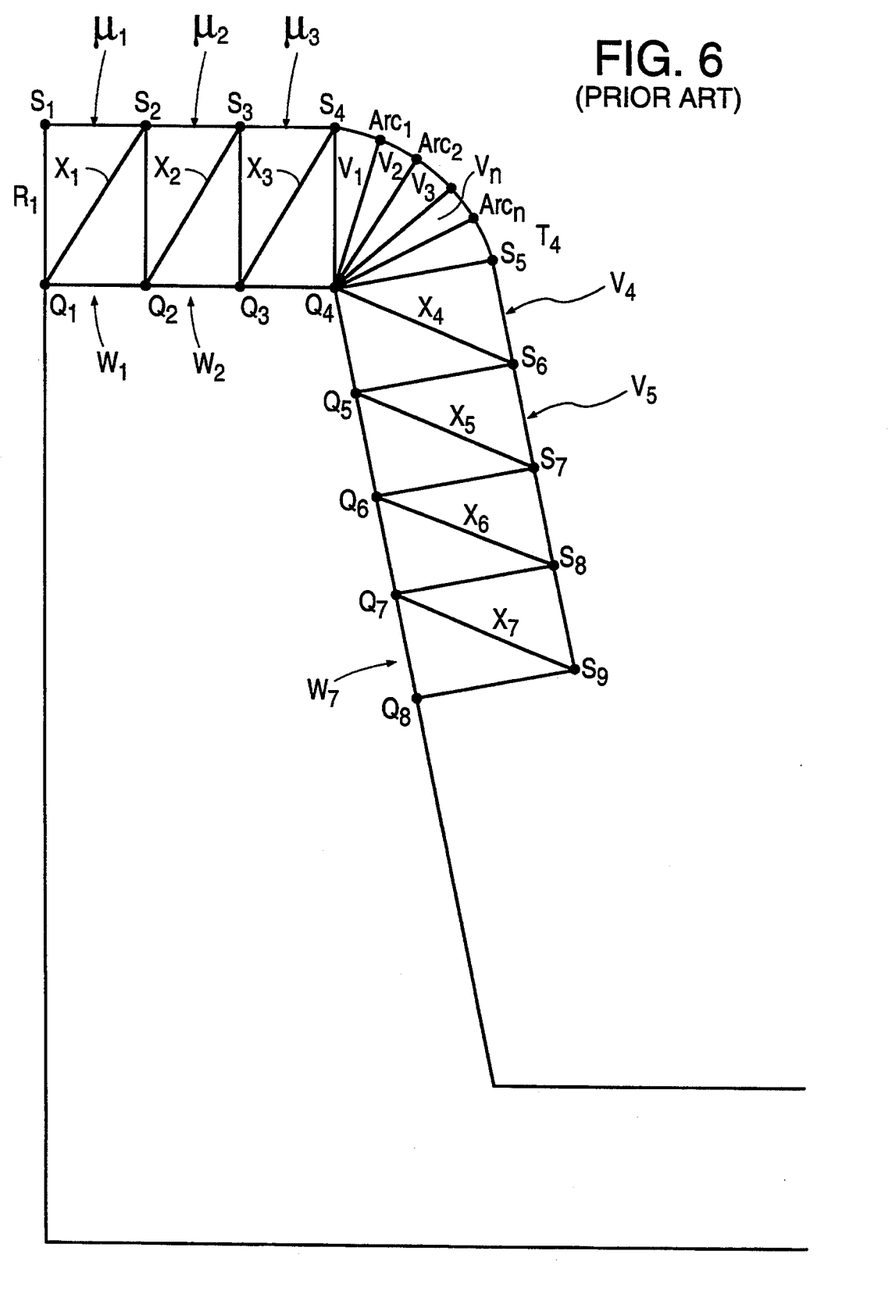
FIG. 6 is a base structure and a simulated layer which is triangulated according to a triangulation method of the prior art.

Referring to FIG. 6, an enlarged diagram of a portion of the convex region A/B of the base structure is shown. In the triangulation method, cross vectors $X_1$ through $X_{n-1}$ are calculated for each box $U_1$ through $U_{n-1}$ respectively using vector mathematics. To construct a cross vector in box $U_1$, for example, vector $W_1$ is first defined along old surface 12. Vector $W_1$ is calculated by the equation:

$$W_1 = Q_2 - Q_1 \qquad [1].$$

The cross vector $X_1$, running diagonally across the box $U_1$, is calculated by the vector addition defined by the equation:

$$X_1 = W_1 + R_2 \qquad [2].$$

The aforementioned equations [1] and [2] are repeated for each box $U_1$ through $U_{n-1}$. Cross vectors $X_1$ to $X_{n-1}$ divide the individual boxes $U_n$ to $U_{n-1}$ into two triangles respectively.

A well known system of finite difference equations uses the triangles of the individual boxes to calculate the doping profile in the material now delineated by the simulated new surface. See Analysis and Simulation of Semiconductor Devices, by Siegfried Selberherr, Springer-Verlag and Weine Press, New York, 1984 for a discussion of the finite difference equations.

This triangulation method, however, also has a number of deficiencies. In particular, some of the triangles created in the triangulation step may be inverted. An inverted triangle is a triangle which does not map one to one with the physical semiconductor device.

Figure 7:
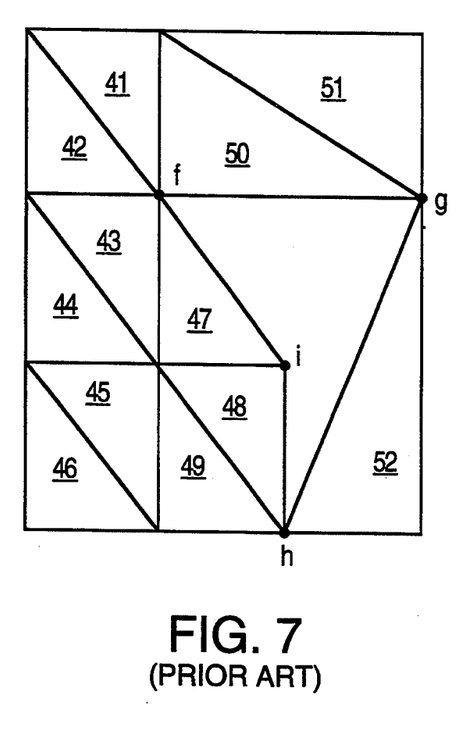
FIG. 7 illustrates a portion of a semiconductor structure during a step of the triangulation method according to the prior art.

Referring to FIG. 7, a portion of a semiconductor structure during the triangulation method is shown. A first portion of the semiconductor structure has been triangulated as illustrated by the grid of triangles 42 through 52. The remainder of the semiconductor structure, delineated by points f, g, h, and i, represent a portion of the semiconductor structure which has not yet been triangulated.

The un-triangulated portion of the semiconductor structure can be triangulated in two ways. First, triangles can be constructed between points (f, g, i and g, h, i). In this situation, the triangles are mapped one to one with the semiconductor structure. Second, triangles can be constructed between points (f, g, h and f, h, i). In this second situation, however, the triangles can not be mapped one to one with the semiconductor structure. Triangle (f, h, i) overlaps a portion of triangle (f, g, h). Thus triangle (f, h, i) is defined as inverted. An inverted triangle signifies that a single coordinate point (i) represents more than one location (non-unique) on the semiconductor structure.

An inverted triangle may affect the outcome of the finite difference equations in calculating the doping profile of the semiconductor structure. Since an inverted triangle by definition represents more than one location on the semiconductor structure, the results of the finite difference equations will generate a non-unique solution i.e., more than one answer for the doping profile problem, when in fact, only one of the answers is correct. Since the triangulation algorithm can not determine which answer is right or wrong, the continued execution of the algorithm is disrupted.

SUMMARY OF THE INVENTION

The present invention relates to an improved method for simulating the surface contours of a layer of material to be formed over a base structure using a string algorithm.

The string algorithm, according to the present invention, generates a plurality of strings, each including an array of points. The points of each string are plotted and key points are then selected to simulate the surface contours of the simulated material to be deposited on the base structure.

The string algorithm of the present invention executes the following steps: In the first step, old surface points are defined at locations along the old surface of the base structure. In the second step, normal vectors are constructed at each old surface point. The end of each normal vector defines a possible new surface point which eventually may be included in the orderly array of points of the string algorithm. In the third step, for each new surface point, a new surface line is generated. Each new surface line is perpendicular to the normal vector from which the surface line originates from and runs in the direction toward the previous new surface point. In the fourth step, one or more strings are defined from the new surface points.

Once the points for each string are obtained, the individual points in each string are plotted and the associated new surface lines are generated therefrom. The exposed portions of the new surface lines simulate the surface contours of the layer of material to be formed over the base structure. If no intersection occurs, the new surface point is discarded from the orderly array of points.

The present invention is thus capable of simulating the surface contours of new surfaces, including those with both service concave and convex regions. As a result, the present invention provides a useful tool for design engineers in building semiconductor devices and the like.

The present invention also relates to an improved selective mapping technique to determine a useful triangulation grid for the simulated structure. The improved mapping technique uses the orderly array of points to eliminate the inclusion of inverted triangles from the finite difference equations, used to calculate the doping profile.

The selective mapping technique includes the following steps: In the first step, boxes are defined in the simulated new surface layer formed by the orderly array of points. In the second step, each box is triangulated by constructing a cross vector between an old surface point and an associated point in the orderly array of points. In the third step, a test is performed on each triangle to determine if it is inverted using vector mathematics. In the event the triangle is not inverted, it is used in the finite difference equations to calculate doping profiles. In contrast, if the resulting triangle is inverted, it is discarded and is not used in the finite difference equation calculations. In place of the discarded triangle, a new triangle is defined by associating the old surface point with the next point in the orderly array of points. The test to determine if the triangle is positive or negative is again repeated.

Accordingly, the problems created by negative triangles are eliminated. The present invention thus provides an accurate method of calculating the dopant profile of a simulated layer of material formed over a semiconductor structure.

DETAILED DESCRIPTION OF THE PRESENT INVENTION

The N-SUPREM4 Method

The present invention relates to an improved N-SUPREM4 (National SUPREM4) method for simulating the surface contours of a layer of material to be formed over a base structure using a string algorithm. The string algorithm, according to the present invention, generates one or more strings, each including an orderly array of points. The combination of the strings are used to define or simulate the surface contours of a material to be deposited over the base structure.

Figure 8:
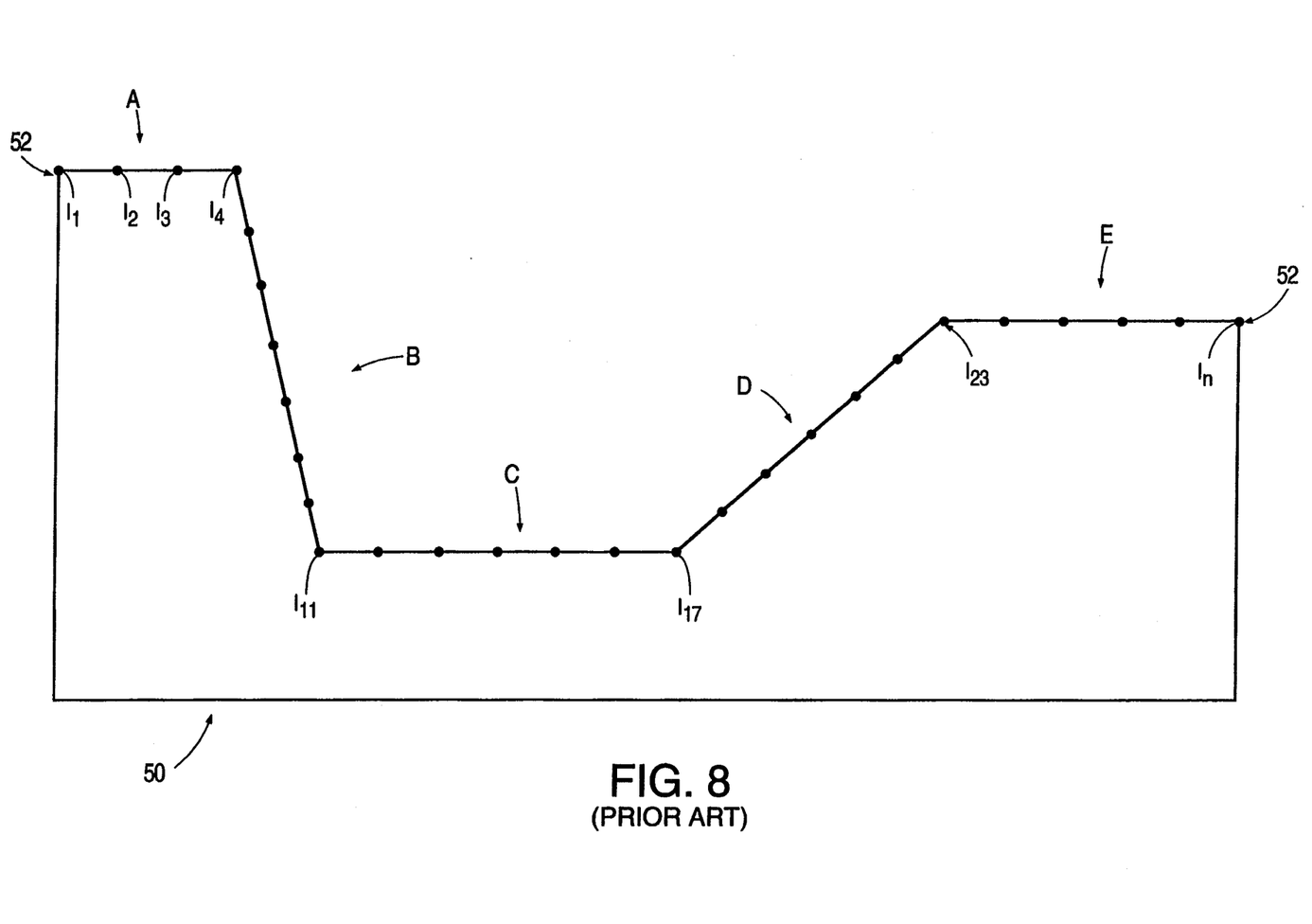
FIG. 8 is a base structure for illustrating the simulation method of the present invention.

Referring to FIG. 8, a base structure is shown. The base structure 50 includes a contoured top surface (hereinafter old surface) 52. The old surface 52 is segmented into a plurality of segments A, B, C, D and E. The segments A through E indicate a change in the surface height or topography of the old surface 52. Concave-shaped regions of old surface 52 are defined by the intersection of segments B/C and C/D, and convex-shaped regions are defined by the intersections of segments A/B and D/E.

In simulating the surface contours of a layer of material to be formed over the base structure 50, the string algorithm of the present invention executes the following steps:

A. In the first step, as illustrated in FIG. 8, old surface points $I_1$ to $I_n$ are defined at equally spaced locations along the old surface 52 of the base structure 50. In a preferred embodiment, the old surface points $I_1$ to $I_n$ are defined at equally spaced locations.

Figure 9:
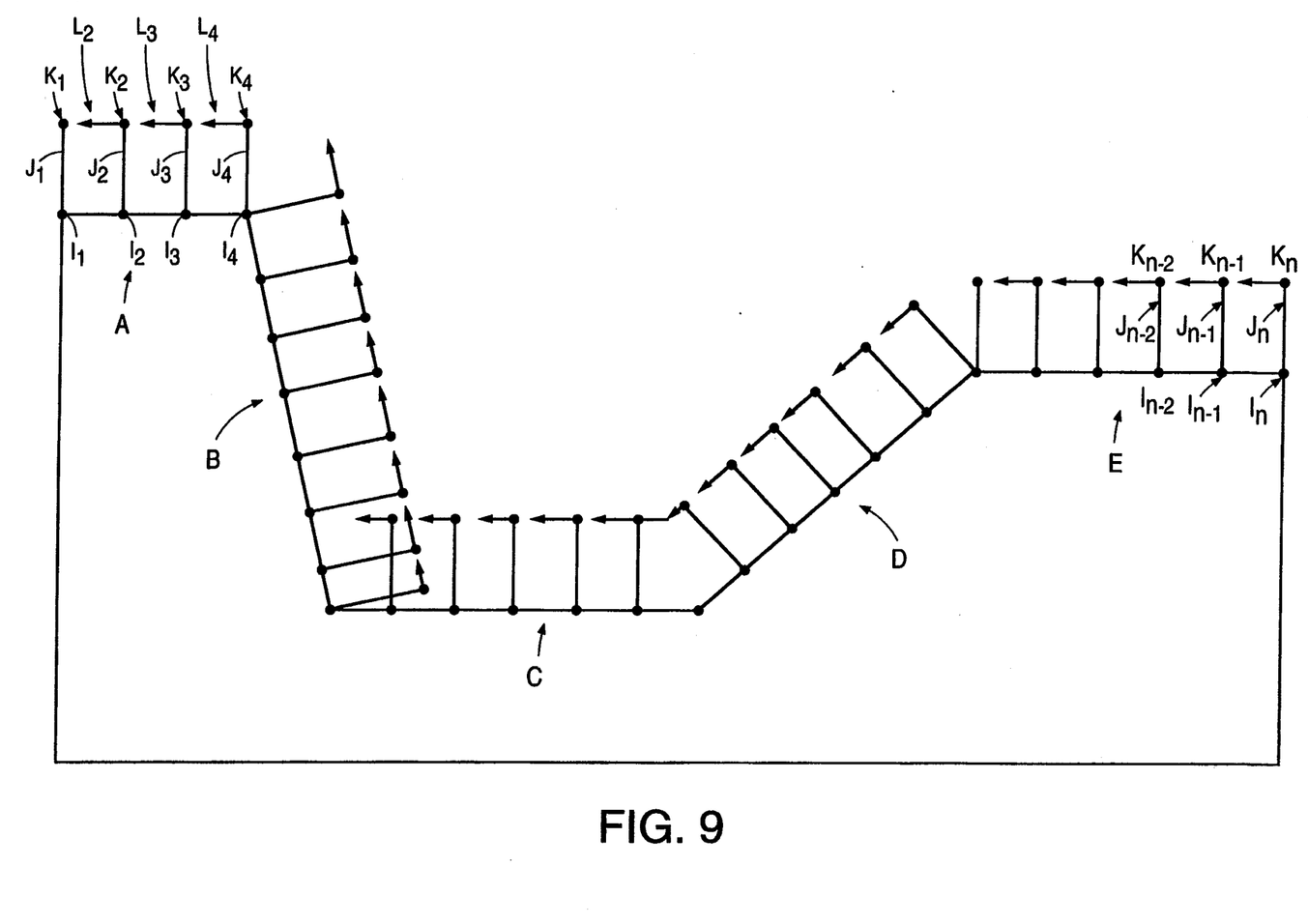
FIG. 9 is the base structure after an intermediate step in the simulation method of the present invention.

B. In the second step, as illustrated in FIG. 9, normal vectors $J_1$ to $J_n$ are constructed at each old surface point $I_1$ to $I_n$ respectively. The end of each normal vector $J_1$ to $J_n$ defines a new surface point $K_1$ to $K_n$ respectively. The length (L) of the normal vectors $J_1$ and $J_2$ are equal to the thickness or height of the layer which is to formed over the old surface 52. For example, if a one micron layer is to be formed over the base structure 50, (L) equals one micron.

C. In the third step of the string algorithm, for each new surface point $K_1$ to $K_n$, new surface lines $L_1$ to $L_n$ are generated respectively. Each new surface line is perpendicular to the normal vector from which the surface line originates. The new surface line also runs in a direction toward the previous new surface point. For example, new surface line $L_3$ runs in a direction toward previous new surface point $L_2$.

Figure 10:
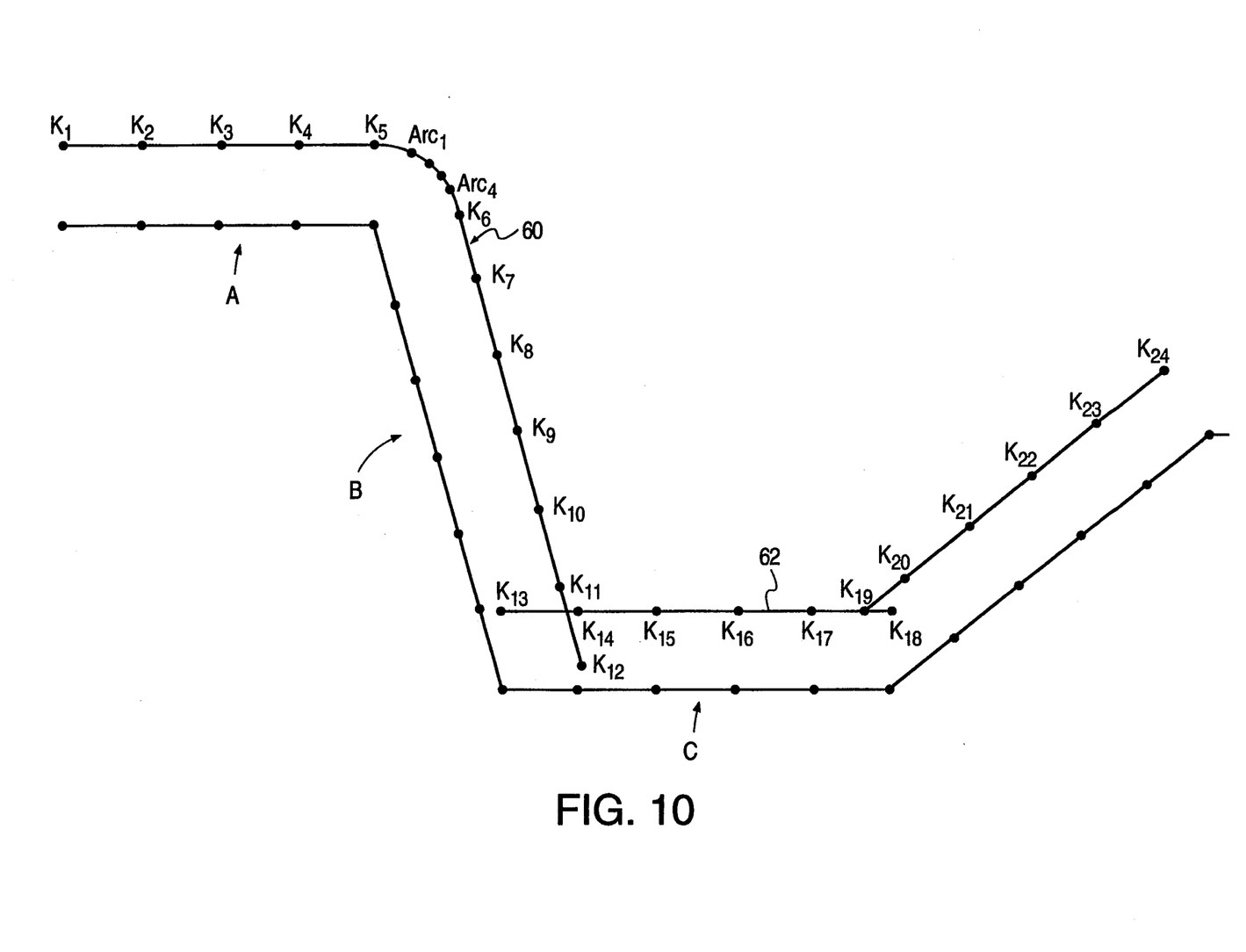
FIG. 10 is the base structure after another intermediate step in the simulation method of the present invention.

D. In the fourth step, one or more strings are defined from the set of new surface points $K_1$ to $K_n$. The strings are then combined to define the simulated new surface. In constructing the individual strings, four situations are considered. Referring to FIG. 10, which shows segments A through D of the semiconductor structure 50, the four situations are illustrated.

(1) The first situation occurs over the relatively flat portion of the semiconductor structure, such as segment A of old surface 52. During the reiteration of step 3 for each new surface point K, if an intersection occurs between the new surface line L and one of the previous surface lines, the new surface point from which the new surface line originates becomes a point in the current string. For example in segment A, since new surface line $L_4$ intersects with the previous new surface line $L_3$, new surface point $K_4$ becomes a point in string 60.

(2) The second situation occurs at convex regions such as defined by the segment A/B. In a manner similar to that described in the prior art and illustrated in FIG. 4, the string algorithm generates new surface points $Arc_1$ through $Arc_n$ which are distributed between the two new surface points $K_5$ and $K_6$. The points $Arc_1$ through $Arc_n$ become part of the string 60.

(3) The third situation occurs at pronounced convex regions, such as formed by segments B/C. As steps one through three are repeated, the new surface points $K_1$ through $K_{11}$ and points $Arc_1$ through $Arc_4$ become points in string 60. At point $K_{12}$ however, an intersection between new surface line does not occur with the previous new surface lines due to the pronounced convex relationship between segments B and C. As a result of the failure to find an intersection, first string 60 is completed and no new points are added to the string. With the conclusion of string 60, a new string 62 is created, beginning with point $K_{13}$.

(4) The fourth situation occurs at less pronounced concave regions, such as that formed by the intersection of segments C/D. For example as illustrated in FIG. 10, new surface line $L_{19}$ intersects the previous new surface line $L_{18}$. Thus new surface point $K_{19}$ becomes a point in string 62. The string 62 is created in accordance with the four situations described above.

Figure 11:
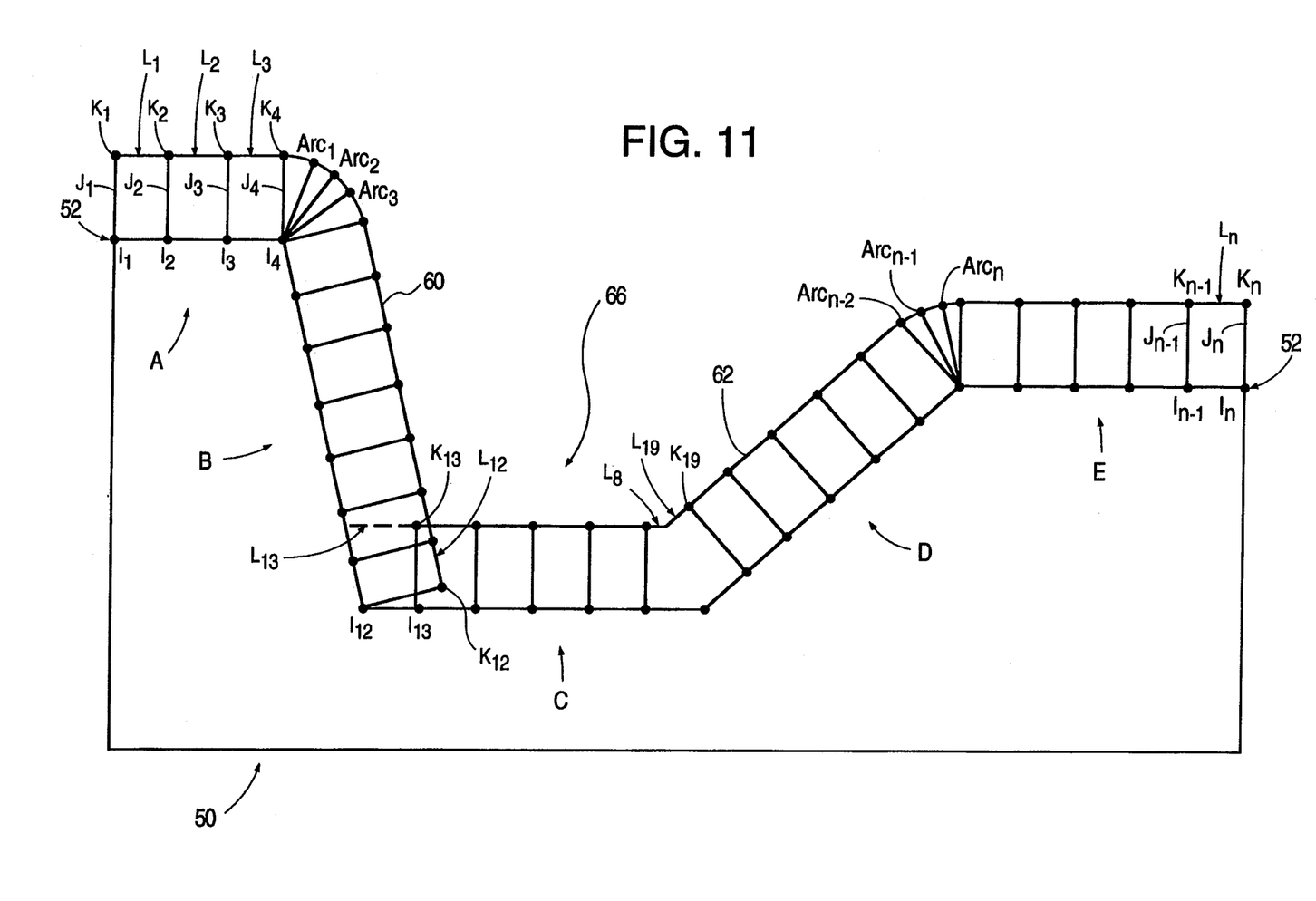
FIG. 11 is the base structure with a simulated layer formed thereon according to the method of the present invention.
Figure 12:
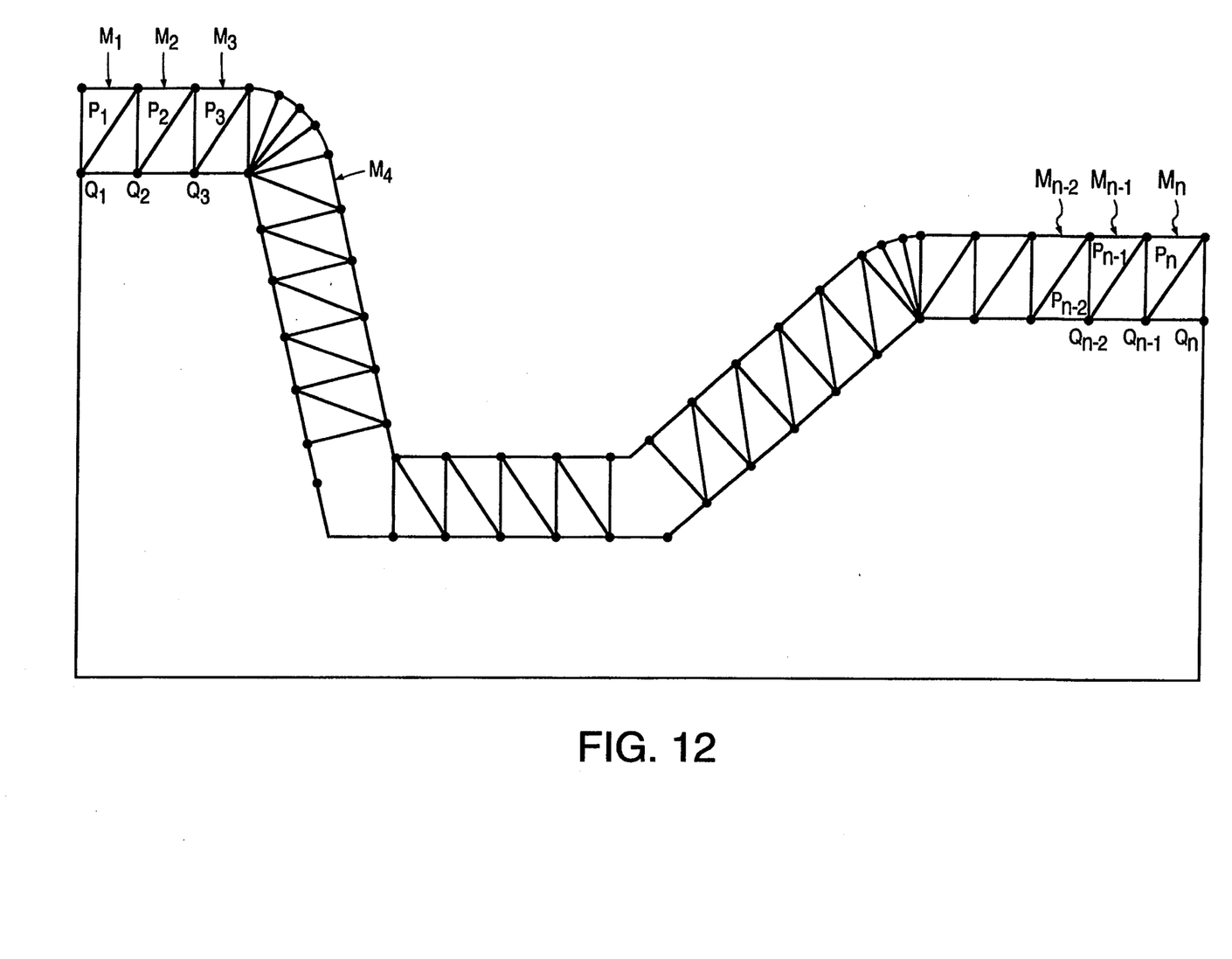
FIG. 12 is the base structure and triangulated simulated layer according to a triangulation method of the present invention.

To simulate the new surface 66, the individual points $K_1$ to $K_n$ of the respective strings are plotted as illustrated in FIG. 11. New surface lines L are then formed at each individual point and are extended back to the previous new surface point. The intersection of one new surface line with previous new surface lines forms the simulated new surface 66. If a particular new surface point does not intersect with a previous new surface point, that particular new surface point is discarded and is not included in the simulation. For example, since new surface line $L_{13}$ does not intersect with a previous new surface line $L_{12}$, new surface point $K_{13}$ is not included in the simulation.

The present invention thus provides a method for simulating new surfaces over complicated old surfaces, such as those that contain both concave and convex regions. As a result, the present invention provides a useful tool for design engineers in building semiconductor devices and the like.

The N-Triangulation Method

The present invention also relates to an improved National Triangulation Method (N-Triangulation) which uses selective mapping techniques to generate the triangulation grid used in the doping profile of the semiconductor structure. The N-Triangulation method relies on the results of the N-SUPREM4 string algorithm as its starting point. The N-Triangulation method uses normal vectors J and new line vectors $L_1$ to divide the simulated surface into boxes $U_1$ to $U_n$.

Referring to FIG. 10, a base structure 50 with a simulated surface formed thereon is shown. The selective mapping technique includes the following steps:

1. In the first step, each old surface point $I_1$ to $I_n$ is associated with the next new surface point $K_2$ to $K_n$ respectively.

2. In the second step, a cross vector is calculated between each of the associated two points. The cross vectors $P_1$ to $P_n$ are calculated using the same vector mathematic method described in the prior art. The cross vectors $P_1$ through $P_n$ divide the boxes $U_1$ through $U_n$ into triangles.

3. In the third step, a test is performed on each triangle to determine if it is inverted using well-known vector mathematic equations. In the event a triangle is not inverted, it is used in the finite difference equations used to calculate doping profiles. In contrast, if the resulting triangle is inverted, it is discarded and is not used in the finite difference equation calculations. Rather, a new box is defined using the next point in the orderly array of points.

Steps one through three are sequentially reiterated. In this manner, all the inverted triangles are discarded, and only positive triangles are used in the finite difference equations. As a result, the present invention provides an accurate method of calculating the dopant profile of a simulated layer of material formed over a semiconductor structure.

Other embodiments of the invention will be apparent to those skilled in the art from a consideration of this specification or practice of the invention disclosed herein. For example, the method of the orderly array of points could be used for simulating the formation of oxides, polysilicon, metals, etc., over semiconductor base structures. It is intended that the specification and examples be considered as exemplary only, with the true scope and spirit of the invention being indicated by the following claims.

What is claimed is:

1. A selective mapping method for calculating a doping profile of a simulated layer of material formed over a semiconductor substrate; the steps comprising:

triangulating the simulated layer of material formed over the semiconductor substrate into a plurality of triangles;

identifying non-inverted triangles in said plurality of triangles; and calculating the doping profile of the semiconductor material using the non-inverted triangles in said plurality of triangles using a series of finite difference equations.

2. A method for simulating the surface contours of a layer of material to be formed over a semiconductor substrate and a selective mapping method for calculating a doping profile of the simulated layer of material formed over the semiconductor substrate, the method comprising the steps of:

defining a string of a plurality of new surface points between a first location and a second location above a surface of a semiconductor substrate upon which a layer of material is to be formed;

plotting the new surface points of the string;

selecting from the plurality of new surface points of the string an orderly array of points which defines surface contours of the layer of material to be formed over the surface of the semiconductor structure;

triangulating the layer of material formed over the semiconductor structure into a plurality of triangles;

identifying non-inverted triangles in the plurality of triangles; and calculating a doping profile of the material using the non-inverted triangles in the plurality of triangles in a series of finite difference equations.

3. A method for simulating the surface contours of a layer of material to be formed over a surface of a base structure, the method comprising the steps of:

defining a plurality of old surface points between a first location and a second location on said surface of said base structure;

defining a normal vector of a length for each of said old surface points, said length being the thickness of said layer of material to be formed;

defining as a string a plurality of new surface points, each surface point being defined at the end point of each one of the normal vectors respectively;

selecting from said new surface points of said string an orderly array of points in accordance with the steps, proceeding from the new surface point corresponding to said first location to the new surface point corresponding to said second location:

(i) selecting a new surface point from said new surface points;
(ii) constructing a new surface line stretching from said selected new surface point to an immediately adjacent new surface point; and
(iii) including in said orderly array of points said selected new surface point, if said new surface line intersects a constructed new surface line; and defining as a surface contour of said layer of material using said orderly array of points.

4. The method of claim 3 wherein the layer of material is polysilicon.

5. The method of claim 3, wherein the layer of material is an oxide.

6. The method of claim 3 wherein the base structure is a semiconductor substrate.

* * * * *